US00RE34641E

United States Patent [19]

Kamada et al.

[11] E Patent Number: Re. 34,641

[45] Reissued Date of Patent: Jun. 21, 1994

[54] METHOD OF PRODUCING ELECTRICAL CONDUCTOR

[75] Inventors: Osao Kamada; Shinichi Nishiyama, both of Ibaraki, Japan

[73] Assignee: Hitachi Cable Ltd., Tokyo, Japan

[21] Appl. No.: 515,777

[22] Filed: Apr. 26, 1990

Related U.S. Patent Documents

Reissue of:

[64] Patent No.: 4,582,545
Issued: Apr. 15, 1986
Appl. No.: 587,774
Filed: Mar. 9, 1984

U.S. Applications:

[63] Continuation of Ser. No. 173,915, Mar. 22, 1988, abandoned.

[30] Foreign Application Priority Data

Mar. 11, 1983 [JP] Japan ..... 58-41154
Jun. 20, 1983 [JP] Japan ..... 58-110426
Jul. 7, 1983 [JP] Japan ..... 58-123650

[51] Int. Cl.[5] ..... C22F 1/08

[52] U.S. Cl. ..... 148/684; 148/680; 148/562

[58] Field of Search ..... 148/432, 11.5 C, 13.2, 148/680, 684, 562

[56] References Cited

U.S. PATENT DOCUMENTS 3,352,722 11/1967 Wang et al. ..... 148/562
4,290,823 9/1981 Dompas ..... 148/508 X
4,311,522 1/1982 Batra et al. ..... 75/153

OTHER PUBLICATIONS

Metal Manual, revised 3rd edition, Sep. 20, 1978.

"Recent Progress in Oxygen Free Copper Conductors for Audio Wire and Cable" *Journal of Japan Audio Society* vol. 23, No. 9, Sep. 1983.

*Primary Examiner*—Melvyn J. Andrews
*Assistant Examiner*—Margery S. Phipps
*Attorney, Agent, or Firm*—Sughrue, Mion, Zinn, Macpeak & Seas

[57] ABSTRACT

A method of producing an electrical conductor is described. The electrical conductor is made of an oxygen-free copper material having an oxygen content of not more than 50 ppm, wherein copper crystals constituting the copper material are giant crystals. These giant copper crystals are formed by heating the copper material in an inert atmosphere maintained at a temperature exceeding 800° C., but below the melting point of copper for at least 15 minutes.

13 Claims, No Drawings

METHOD OF PRODUCING ELECTRICAL CONDUCTOR

Matter enclosed in heavy brackets [ ] appears in the original patent but forms no part of this reissue specification; matter printed in italics indicates the additions made by reissue.

*This is a continuation of application Ser. No. 07/173,915, filed Mar. 22, 1988, now abandoned, which is a Reissue of application Ser. No. 06/587,774, filed Mar. 9, 1984, now U.S. Pat. No. 4,582,545.*

BACKGROUND OF THE INVENTION

The present invention relates to a method of producing an electrical conductor suitable for transmitting multi-frequency signal such as an audio signal or a video signal.

As is well known, an electrical conductor is generally made of one of two types of copper: tough pitch copper (TPC) and oxygen-free copper (OFC) The copper is generally worked so as to be circular or rectangular in cross section or in the form of a foil and then recrystallized by annealing at a temperature ranging between 300° and 600° C. to produce the conductor.

It has recently been understood that an electrical conductor made of OFC in a transmission line for a multi-frequency audio signal, particularly, as an inner wiring conductor or a loud speaker wiring conductor of an audio apparatus, is much superior to one made of TPC. The reason for this has been considered that the conductivity of OFC is higher than that of TPC. Based on this concept, it was thought that superior sound signals could be obtained by increasing the cross-sectional area of a conductor. However, it has been revealed by the experiments conducted by the inventor that the sound signal quality does not change very much when the cross-sectional area of the conductor is changed.

These precious findings, as described hereinafter, were obtained by the inventor's study of the relationship between the tone quality of an audio apparatus and an electrical conductor used therein.

Metallic copper is composed of a number of fine crystals in the ordinary state, and oxygen contained in the copper is present along crystal boundaries, mainly in the form of cuprous oxide, which is inherently a semiconductor. Thus, the presence of such cuprous oxide means that distributed capacitances are associated with each grain; both a parallel capacitance across the grain and a series capacitance between adjacent grains.

The dielectric effect of the cuprous oxide along crystal boundaries increases the magnitude of the distributed capacitances. Also, the magnitudes of the distributed capacitances changes depending on the frequency. Hence, an audio signal including high-frequency components is subject to distortion in phase and an attenuation in amplitude due to this inherent capacitance. Such distortion in phase and attenuation is detectable by the ear.

In an electrical conductor of OFC produced by annealing at a temperature of about 400° C., the average grain size of crystals is about 20 μm. Thus, it may be considered that about 50,000 capacitors per meter are present in the lengthwise direction of such a conductor. On the other hand, in an electrical conductor made of TPC, about 150,000 capacitors per meter are present in the conductor since the crystal grain diameter of TPC is about one-third to one-fourth that of OFC.

In view of the above described fact, the use of an OFC conductor results in a superior sound quality to that obtained with TPC. This finding applies not only to audio signals but also to video and other signals.

An electrical conductor of OFC is much superior to a conductor of TPC with respect to transmission of multi-frequency signal components. However, an OFC conductor still contains, as described above, a large amount of cuprous oxide along crystal grain boundaries and, therefore it is of insufficient quality to realize optimum transmission characteristics.

SUMMARY OF THE INVENTION

An object of the invention is to provide a method of producing an electrical conductor which is superior to the conventional electric conductor of OFC with respect to high-frequency signal transmission characteristics.

In accordance with the above object, the present invention provides a method for producing an electrical conductor which comprises holding an oxygen-free copper material having an oxygen content of not more than 50 ppm in an inert atmosphere maintained at a temperature exceeding 800° C. but below the melting point of copper for at least 15 minutes to make the crystal size larger.

DESCRIPTION OF THE PREFERRED EMBODIMENT

In view of the above described facts, an ideal transmission line would be obtained if an electric conductor could be made of a monocrystalline material or an amorphous material containing no crystals. It is impossible, however, to produce a monocrystalline electrical conductor with present technology. Mercury, which is amorphous at ordinary temperatures, can be used as an electrical conductor material. Mercury, however, is liquid at ordinary temperatures and furthermore is toxic. Therefore, it cannot be used to produce an electrical conductor for ordinary commercial use.

As a result of extensive investigations to reduce the number of [crysta] *crystal* boundaries in copper, which is, the material most widely used in the production of an electrical conductor, it has been found that if an oxygen-free copper material having an oxygen content of not more than 50 ppm is held in an inert atmosphere maintained at a temperature exceeding 800° C. but below the melting point of copper for at least 15 minutes "giant" crystals, for example, having an average crystal diameter of about 400 μm can be obtained. An electric conductor produced using copper in the above described state exhibits superior multi-frequency transmission characteristics since the number of crystal boundaries is reduced. It has further been found that the number of crystal boundaries in the lengthwise direction can be further reduced by stretching the giant crystals in the lengthwise direction, resulting in the production of an electrical conductor exhibiting yet more superior multi-frequency transmission characteristics.

The copper that can be used in the present invention is limited to an oxygen-free copper (OFC) having an oxygen content of not more than 50 ppm, preferably not more than 15 ppm, and more preferably not more than 5 ppm. If copper having an oxygen content of 300 to 500 ppm is heated at a temperature exceeding 800° C., cuprous oxide tends to concentrate along crystal boundaries, preventing the growth of large copper crystals and resulting in the production of an electrical conductor which is very brittle and which can be readily broken on bending.

It is generally known that OFC can be annealed at a temperature ranging between 300° and 600° C. and used as an electrical conductor. However, the average crystal diameter of the thus-produced copper wire is usually between about 15 and 25 μm (OFC in this state is hereinafter referred to as "OFC-A").

On the other hand, if OFC is heated in an inert atmosphere at a temperature exceeding 800° C., crystals gradually grow, and when the temperature reaches 900° C., there are formed giant crystals having an average crystal diameter of from about 400 to 500 μm (OFC in giant crystal state is hereinafter referred to as "GC-OFC"). In this case, only about 2,000 crystals are present per meter of the conductor, and thus the number of crystal boundaries is reduced to about a twentieth that of OFC-A, providing a corresponding reduction in total capacitance. Thus the resulting electrical conductor exhibits superior multi-frequency transmission characteristic.

Further astonishingly, if GC-OFC is stretched by drawing, the [crystal] *crystals* assume a linear orientation in the form of long fibers and are converted into straight crystals ("OFC in this state is hereinafter referred to as LC-OFC").

The crystals are orientated in a nearly straight form at a reduction working ratio of about ¼ in diameter and in a completely straight form at a reduction working of about 1/10 in diameter. For example, in the case of LC-OFC stretched at a reduction working of about 1/10 in diameter, individual crystal grains are stretched to 100 times their original length, reaching a length of about 50 mm. This means that only 20 crystals are present [permeter] *per meter* of the conductor.

The electrical conductor of the invention is especially suitable for use in transmission of multi-frequency signals. Thus the electrical conductor of the invention can be used as conductors of a coaxial cable, a speaker cable, a voice coil winding, a transformer coil, a phono cartridge coil, capacitor leads, resistor leads, and a conductor of a printed circuit used in audio and video apparatuses. Furthermore, the conductor of the invention can be used as a conductor in high-speed digital circuit, and is especially useful as a signal transmission cable or an interface cable, for example, in an information processing apparatus such as a computer.

The present invention will now be described in greater detail with reference to the following examples.

EXAMPLE 1

OFC having an oxygen content of 5 ppm was worked by the usual method to produce a copper wire having an outer diameter of 1.8 mm. This copper wire was recrystallized by heating in an argon gas atmosphere at a temperature of 900° C. for 90 minutes and then cooling to produce a GC-OFC wire having an average crystal diameter of about 500 μm. A polyethylene insulating material was extrusion coated around the GC-OFC wire to produce an insulated electrical wire.

With the above produced insulated electrical wire used as a speaker cable, the total quality reproduced by a stereo set was determined. A sensory evaluation technique was used since there is no known numerical method for evaluating overall tonal quality. The tonal quality in this case was judged to be very excellent.

EXAMPLE 2

OFC having an oxygen content of 3 ppm was worked by the usual method to produce a copper wire having an outer diameter of 1.8 mm. This copper wire was recrystallized by heating in an argon gas atmosphere at a temperature of 900° C. for 90 minutes and then cooling to produce a GC-OFC wire having an average crystal diameter of about 500 μm. Then the GC-OFC wire was cold drawn to produce a LC-OFC wire having an outer diameter of 0.18 mm.

Fifty-four LC-OFC wires produced as described above were stranded together, and polyethylene insulating material was extrusion coated therearound to produce an insulated electrical wire.

With the above produced insulated electrical wire used as a speaker cable, the tonal quality reproduced by a stereo set was determined. A sensory test was done by 16 persons. The evaluation results were as follows;

(1) Very natural sound.
(2) Very clear sound (this means LC-OFC has no phase distortion).
(3) Signal built-up is rapid and transient characteristics are superior.
(4) Sound images are sharp and orientation of the sound is clear.

EXAMPLE 3

LC-OFC wire having an outer diameter of 0.18 mm as produced in Example 2 was used as an outer conductor of a coaxial cable used in transmission of signals between a VTR and TV. The TV image was very fine in grain, improved in brightness, and was of a very high resolution.

EXAMPLE 4

A 35 μm thick copper foil produced by working OFC having an oxygen content of 5 ppm was heated in an argon atmosphere at a temperature of 900° C. for 60 minutes and then cooled to produce a GC-OFC foil. Two GC-OFC foils as produced above were laminated on opposed surfaces of a 0.8 mm thick Teflon TM-impregnated glass substrate by the use of an adhesive to produce a printed substrate.

EXAMPLE 5

A 70 μm thick copper foil produced by working OFC having an oxygen content of 5 ppm was heated in an argon atomosphere maintained at a temperature of 900° C. for 90 minutes and then cooled to produce a GC-OFC foil. This GC-OFC foil was stretched in the lengthwise direction by cold rolling while controlling its stretching in the traverse direction to produce a 35 μm thick LC-OFC foil. Two LC-OFC foils were laminated on opposed surfaces of a 0.8 mm thick Teflon TM-impregnated glass substrate by the use of an adhesive to ptoduce a printed substrate.

The printed substrates produced in Examples 4 and 5 were tested for resonance at 10 GHz to determine the selectivity Q. The results are shown in Table below. For comparison, printed substrates were produced in the same manner as in Examples 4 and 5 except that TPC and OFC foils which had not been annealed were used. Their selectivities were determined and are also shown in the Table.

TABLE

| Run No | Q Value |
|---|---|
| Example 4 | 513 |
| Example 5 | 543 |
| TPC (not annealed) | 395 |
| OFC (not annealed) | 452 |

The selectivity Q is defined as follows:

$$Q=\frac{1}{2}\pi f_0 CR$$

where $f_0$ represents a resonance frequency, C represents an electrostatic capacitance, and R represents a direct current resistance.

Assuming C=Ce+Cm (where Ce represents an electrostatic capacity as determined by the dielectric characteristics of the Teflon-impregnated glass substrate, and Cm represents an electrostatic capacity present in the interior of the copper conductor), it is understood that the number of capacity components present in the copper conductor decreases as the crystalline size is increased; that is, the number of crystal boundaries is decreased.

In the electric conductor of the invention, as described above, the crystal grains are increased in size or shaped in a straight form. This enables [to minimize] *minimization of* the capacity reactance due to the action of copper biozide and to greatly reduce the adverse influence such as phase distoration and signal attenuation as exerted on high frequency signals composed of a number of frequency components. Thus the use of the electric conductor of the invention enables to realize excellent high frequency signal transmission characteristics.

We claim:

1. A method for improving multi-frequency signal transmission characteristics of an electrical conductor consisting essentially of an oxygen-free copper material having an oxygen content of not more than 50 ppm, comprising the steps of:

heating the electrical conductor made of an oxygen-free copper material having an oxygen content of not more than 50 ppm in an inert atmosphere at a temperature exceeding 800° C. but below the melting point of copper for at least 15 minutes to form giant copper crystals *which have an average crystal diameter of at least 400 μm.*

2. The method as claimed in claim 1, wherein the oxygen content of said oxygen-free copper material is not more than 15 ppm.

3. The method as claimed in claim 1, wherein the oxygen content of said oxygen-free copper material is not more than 5 ppm.

4. The method as claimed in claim 1, wherein said oxygen-free copper material is heated in an inert gas atomosphere at a temperature exceeding 850° C. but below the melting point of copper for at least 30 minutes to form giant copper crystals.

5. A method for improving multi-frequency signal transmission characteristics of an electrical conductor consisting essentially of an oxygen-free copper material having an oxygen content of not more than 50 ppm, comprising the steps of:

heating the electrical conductor made of an oxygen-free copper material having an oxygen content of not more than 50 ppm in an inert atmosphere at a temperature exceeding 800° C. but below the melting point of copper for at least 15 minutes to form giant copper crystals, and orienting the thus-formed giant copper crystals in a linear orientation by stretching said conductor in the lengthwise direction thereof.

6. The method as claimed in claim 5, wherein the oxygen content of said oxygen-free copper material is not more than 15 ppm.

7. The method as claimed in claim 5, wherein the oxygen content of said oxygen-free copper material is not more than 5 ppm.

8. The method as claimed in claim 5, wherein said oxygen-free copper material is heated in an inert gas atmosphere at a temperature exceeding 850° C. but below the melting point of copper for at least 30 minutes to form giant copper crystals.

9. The method as claimed in [claime] *claim* 5, wherein said giant copper crystals are cold stretched by cold drawing.

10. The method as claimed in claim 5, wherein said giant copper crystals are stretched by cold rolling.

*11. A method for producing a copper electrical conductor consisting essentially of oxygen-free copper having an oxygen content of not more than 50 ppm, said electrical conductor being characterized by improved multi-frequency signal transmission characteristics and being usable for multi-frequency signal transmission for an electrical apparatus, comprising*

*(A) forming giant crystal grains which have an average crystal diameter of at least 400 μm in said oxygen-free copper electrical conductor and*

*(B) then stretching said oxygen-free copper electrical conductor in its lengthwise direction to form an oxygen-free copper electrical conductor having giant crystals oriented in the linear direction.*

*12. The method as claimed in claim 11 wherein said step (A) of forming giant crystal grains is carried out by heating said conductor at a temperature exceeding 800° C.*

*13. The method as claimed in claim 12 wherein said step (A) of forming giant crystal grains is carried out in an inert atmosphere.*

* * * * *